(12) United States Patent
Kamgaing et al.

(10) Patent No.: US 10,291,283 B2
(45) Date of Patent: May 14, 2019

(54) TUNABLE RADIO FREQUENCY SYSTEMS USING PIEZOELECTRIC PACKAGE-INTEGRATED SWITCHING DEVICES

(71) Applicant: Intel Corporation, Santa Clara, CA (US)

(72) Inventors: Telesphor Kamgaing, Chandler, AZ (US); Feras Eid, Chandler, AZ (US); Adel A. Elsherbini, Chandler, AZ (US); Georgios C. Dogiamis, Gilbert, AZ (US); Vijay K. Nair, Mesa, AZ (US); Johanna M. Swan, Scottsdale, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/088,996

(22) Filed: Apr. 1, 2016

(65) Prior Publication Data

US 2017/0288724 A1 Oct. 5, 2017

(51) Int. Cl.
*H04B 1/48* (2006.01)
*H03H 7/38* (2006.01)
(Continued)

(52) U.S. Cl.
CPC ............ *H04B 1/48* (2013.01); *H03H 7/38* (2013.01); *H01H 57/00* (2013.01); *H01H 2057/006* (2013.01); *H03H 2015/005* (2013.01)

(58) Field of Classification Search
CPC combination set(s) only.
See application file for complete search history.

(56) References Cited

U.S. PATENT DOCUMENTS 4,501,018 A * 2/1985 Shanley ............... H04B 1/54
455/83
5,880,921 A * 3/1999 Tham ............... H01H 59/0009
333/262

(Continued)

FOREIGN PATENT DOCUMENTS

JP 2013-118234 6/2013
WO WO 2004-047190 6/2004
(Continued)

OTHER PUBLICATIONS

International Search Report and Written Opinion from PCT/US2017/017243 dated May 25, 2017, 11 pgs.
(Continued)

*Primary Examiner* — Wednel Cadeau
(74) *Attorney, Agent, or Firm* — Schwabe, Williamson & Wyatt, P.C.

(57) ABSTRACT

Embodiments of the invention include a tunable radio frequency (RF) communication module that includes a transmitting component having at least one tunable component and a receiving component having at least one tunable component. The tunable RF communication module includes at least one piezoelectric switching device coupled to at least one of the transmitting and receiving components. The at least one piezoelectric switching device is formed within an organic substrate having organic material and is designed to tune at least one tunable component of the tunable RF communication module.

22 Claims, 9 Drawing Sheets

(51) Int. Cl.
*H01H 57/00* (2006.01)
*H03H 15/00* (2006.01)

(56) References Cited

U.S. PATENT DOCUMENTS

| | | | |
|---|---|---|---|
| 6,104,119 | A | 8/2000 | Guzik et al. |
| 6,808,954 | B2 | 10/2004 | Ma et al. |
| 7,002,436 | B2 | 2/2006 | Ma et al. |
| 7,339,446 | B2 | 3/2008 | Su et al. |
| 7,354,788 | B2 | 4/2008 | Bar-Sadeh et al. |
| 8,369,796 | B2 | 2/2013 | Pan et al. |
| 2004/0211654 | A1* | 10/2004 | Park .................. H01H 57/00 200/10 |
| 2008/0261540 | A1* | 10/2008 | Rohani ............... H04B 1/406 455/77 |
| 2009/0256444 | A1* | 10/2009 | Suzuki ................. H03H 3/10 310/313 B |
| 2011/0107570 | A1 | 5/2011 | Hwang et al. |
| 2011/0237204 | A1 | 9/2011 | Jamneala et al. |
| 2015/0002984 | A1 | 1/2015 | Teh et al. |
| 2017/0077130 | A1* | 3/2017 | Hu .................... H01L 23/5226 |

FOREIGN PATENT DOCUMENTS

| | | |
|---|---|---|
| WO | WO-2007/084094 | 7/2007 |
| WO | WO-2012/087287 | 6/2012 |

OTHER PUBLICATIONS

International Preliminary Report on Patentability for International Patent Application No. PCT/US2017017243, dated Oct. 11, 2018, 8 pages.

* cited by examiner

TUNABLE RADIO FREQUENCY SYSTEMS USING PIEZOELECTRIC PACKAGE-INTEGRATED SWITCHING DEVICES

FIELD OF THE INVENTION

Embodiments of the present invention relate generally to semiconductor package integrated devices. In particular, embodiments of the present invention relate to tunable radio frequency (RF) systems using piezoelectric semiconductor package integrated switching devices.

BACKGROUND OF THE INVENTION

RF circuits including baluns, filters, matching networks and diplexers are widely used in the RF front-end module (FEM) of many wireless communication systems. For multimode and multi-band systems as illustrated in FIG. 1, individual transmit and receive chains have to be implemented to support each radio and each frequency band even when simultaneous operation of the bands is not required. In some cases, the device performance may also be influenced by the operation environment such as antenna detuning due to the interaction with the human body. Tunable systems provide the unique ability to reuse the same hardware for frequency bands not operating simultaneously or to adjust the system performance based on the operation environment. FIG. 1 shows the block diagram of a complete wireless communication system 100 that includes a digital component 110, a digital and analog component 120, and a RF component 130.

DETAILED DESCRIPTION OF THE INVENTION

Figure 1:
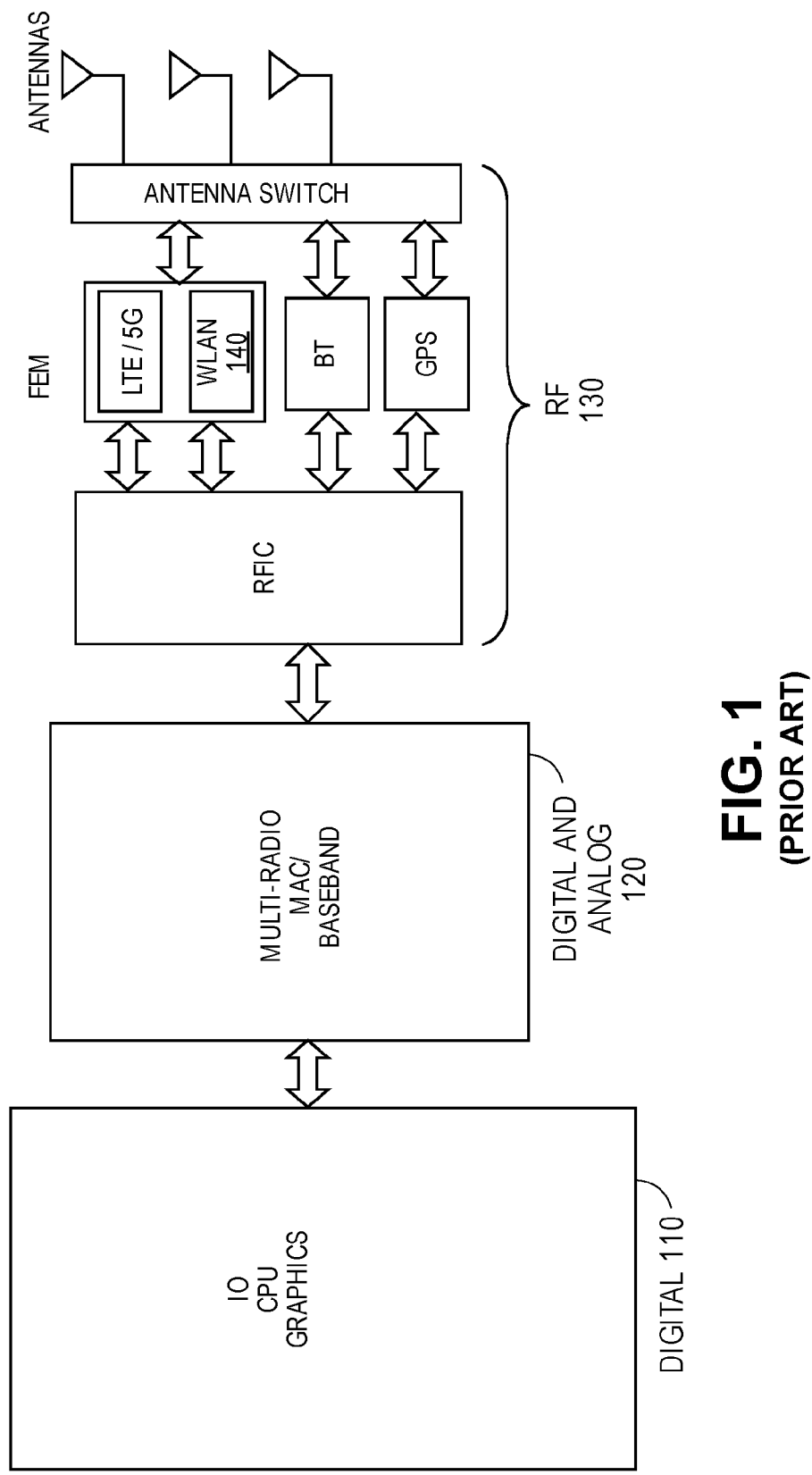
FIG. 1 illustrates a conventional RF system.

Described herein are tunable radio frequency (RF) systems that are implemented using piezoelectric semiconductor package integrated switching devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Micro-electromechanical system (MEMS) switches provide a low loss, low power, highly linear, with respect to input power, alternative to existing solid state switch technologies and have dominated the switch market for RF communication systems. Despite these advantages, this technology is very expensive due to the inherent large manufacturing costs of MEMS devices on silicon.

The present design addresses the fabrication of MEMS switches within the semiconductor package substrate that is compatible with high volume package substrate fabrication technology. This present design for MEMS switches integrated in a package substrate is based on the ability to deposit piezoelectric materials in the package substrate and create movable structures in the substrate.

In one embodiment, this technology allows the fabrication of micro-electromechanical piezoelectric switches utilizing substrate manufacturing technology. These switches include released structures such as cantilevers or beams that are free to move in one or more directions and thus opening or closing a signal path. The connection might be a direct conductive connection or based on capacitive coupling of RF signals. The structures contain stacks of piezoelectric material and electrodes that can be used to apply a voltage to the piezoelectric layer. Applying a voltage across the electrodes produces a stress in the piezoelectric material, causing the stack, and thus the entire released structure, to move. This in turn produces the mechanical displacement needed to switch between different paths in the microelectronic system.

The present design results in package-integrated switches, thus enabling smaller and thinner systems in comparison to discrete switches attached to a substrate or board. The package-integrated switches do not add a Z height (along the vertical axis) to a total height of a substrate or multiple substrates. This present design can be manufactured as part of the substrate fabrication process with no need for purchasing and assembling discrete components. It therefore enables high volume manufacturability (and thus lower costs) of systems that need switching devices (e.g., RF Filters, sampling switches, XY array addressing switches, etc). Package-integrated switches also have lower contact resistance in comparison to integrated switches on a silicon substrate with a limited contact area and higher contact resistance.

In one example, the present design includes package-integrated structures to act as RF MEMS switches. Those structures are manufactured as part of the package layers and are made free to move by removing the dielectric material around them. The structures are actuated by piezoelectric stacks that are deposited and patterned layer-by-layer into the package. The present design includes creating functional switches in the package on the principle of suspended and movable structures. The dielectric material in the package— is selectively removed to create cavities. Piezoelectric material deposition (e.g., 0.5 to 1 μm deposition thickness) and crystallization also occurs in the package substrate during the package fabrication process. An annealing operation at a lower substrate temperature range (e.g., up to 260° C.) allows crystallization of the piezoelectric material (e.g., lead zirconate titanate (PZT), potassium sodium niobate (KNN), aluminum nitride (AlN), zinc oxide (ZnO), etc) to occur during the package fabrication process. In one example, laser pulsed annealing occurs locally with respect to the piezoelectric material for the annealing operation without damaging other layers of the package substrate (e.g., organic substrate).

The present design enables tunable RF circuits on package using piezoelectric switches fabricated as part of the package substrate. Those switches are then used to enable reconfigurable RF circuits by connecting components (e.g., resistive, inductive, or capacitive) to other networks (e.g., a resonator network structure). The components to be switched can be either standalone or form part of a larger network.

Conventional tunable circuits utilize a capacitor bank on silicon, diodes and on-die switches that allow one to set desired capacitance by connecting one or more switches to the capacitor bank. The present design builds tunable circuits using panel-level organic substrate technology which is more cost effective than wafer-based silicon microfabrication. Thus, the tunable circuits in the present design provide much smaller form factor (e.g., 30% smaller form factor for wireless LAN) than traditional un-tuned multiband systems. The tunability enables a reduction in both component count and costs.

FIG. 1 shows a generic wireless system architecture with non-reconfigurable components. The RF section 130 contains several Front-end modules (FEM) such as WLAN 140, LTE/5G, BT, and GPS."

Figure 2:
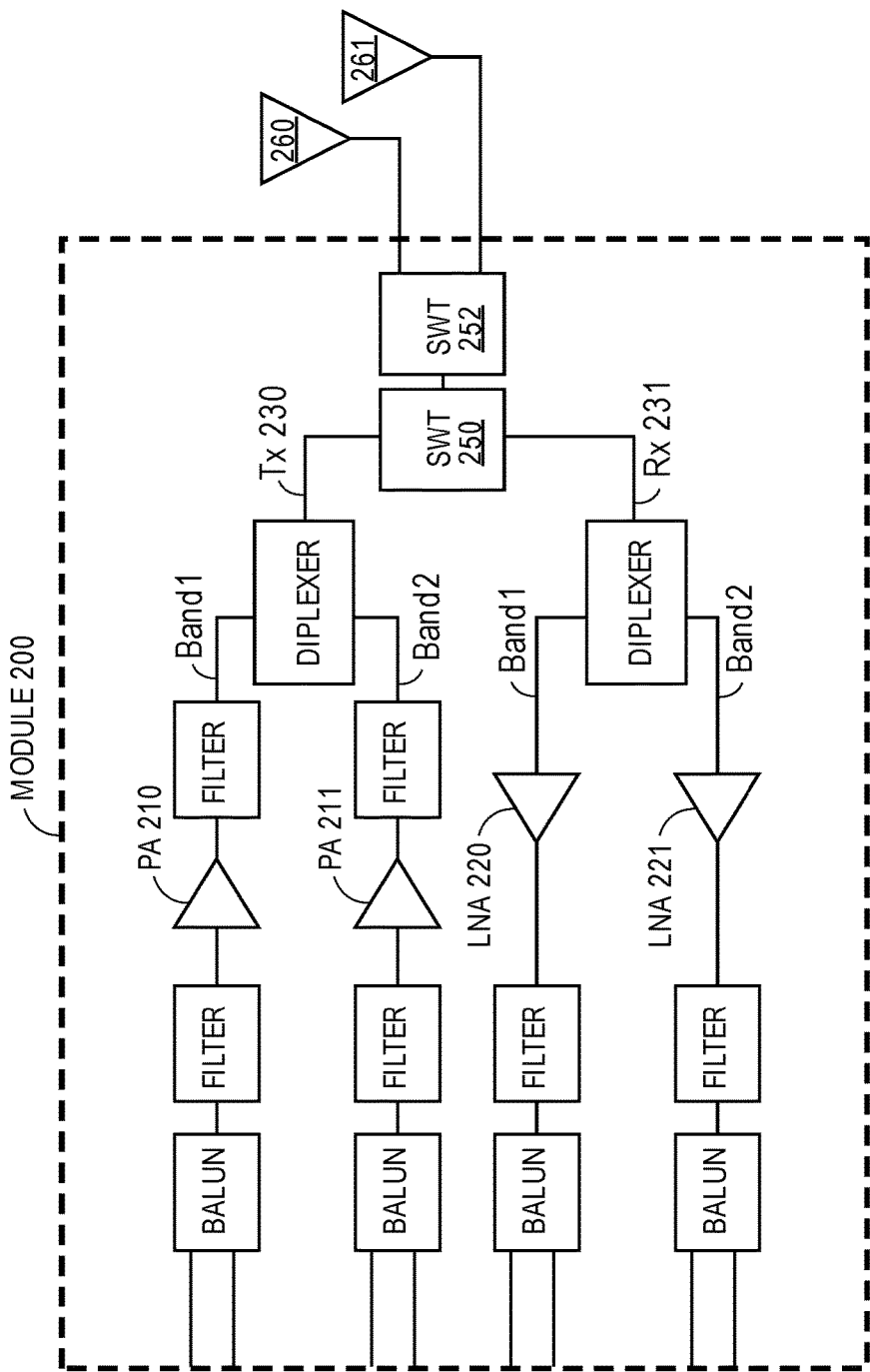
FIG. 2 illustrates a block diagram of a non-reconfigurable wireless LAN RF front-end module.

FIG. 2 illustrates a block diagram of a non-reconfigurable wireless LAN RF front-end module 200. The RF module 200 (e.g., WLAN 140 of FIG. 1), operating in two frequency bands 1 and 2, consists of a transmit path 230 and receive path 231. The Transmit path 230 includes baluns, filters, diplexer, power amplifiers 210 and 211. Similarly the receive path 231 includes baluns, filters, diplexer, and low noise amplifiers 220 and 221.The switches 250 and 252, and antennas 260 and 261 are connected to the transmit and receive path for data transmission. This is shown to illustrate the complexity and increase in building blocks to support multi-band operation for the wireless LAN RF front-end module.

Figure 3:
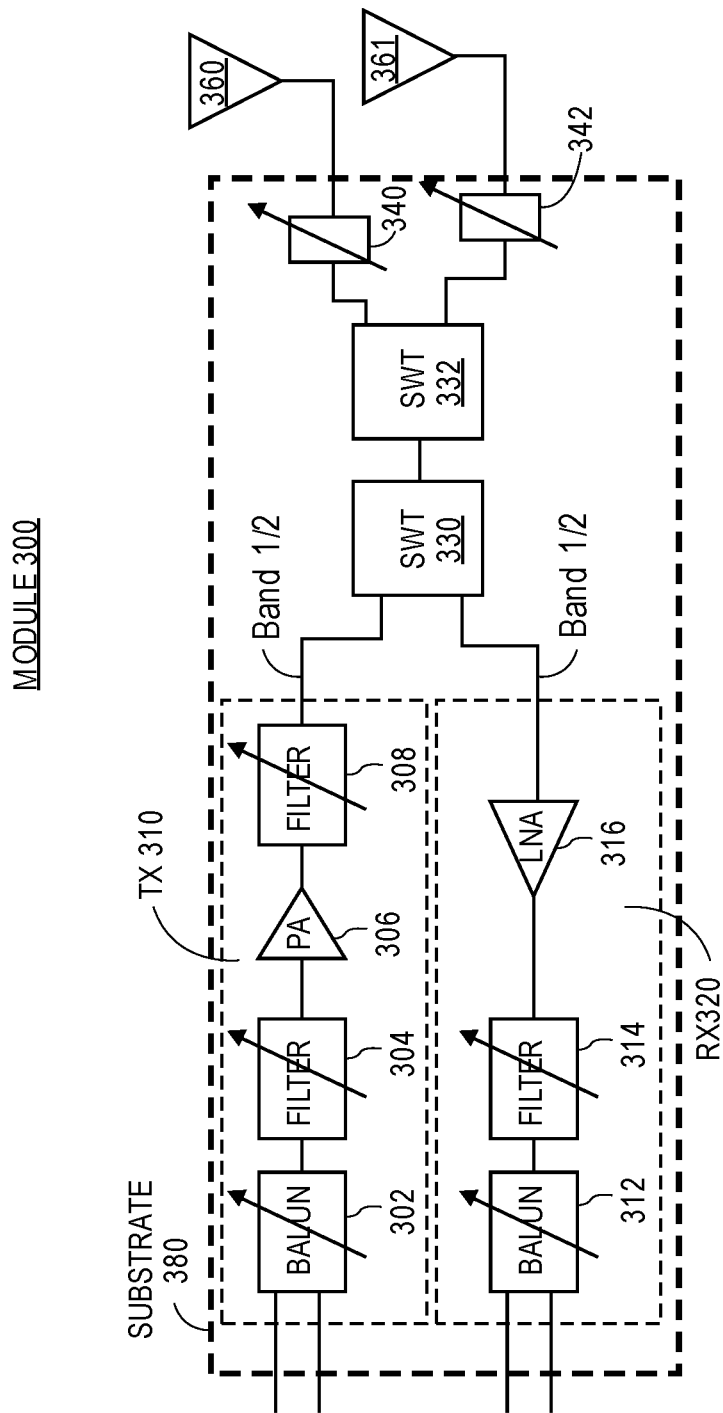
FIG. 3 illustrates a block diagram of a reconfigurable wireless LAN RF front-end module 300 having package-integrated piezoelectric switches in accordance with one embodiment.

FIG. 3 illustrates a block diagram of a reconfigurable wireless communication module 300 (e.g., LAN RF front-end module 300) having package-integrated piezoelectric switches in accordance with one embodiment. The RF communication module 300 includes a transmitting component 310 having an adjustable tunable balun 302, adjustable tunable filters 304 and 308, and a power amplifier component 306 for transmitting communications with frequency bands 1 and 2 based on frequency tuning with the adjustable components. A receiving component 320 includes an adjustable tunable balun 312, an adjustable tunable filter 314, and a low noise amplifier component 316 for receiving communications with frequency bands 1 and 2 based on frequency tuning with the adjustable components. The RF module 300 also includes switches 330 and 332, adjustable tunable matching network components 340 and 342, and antenna units 360 and 361. Thus, the reconfigurable wireless LAN front-end module 300 includes fewer components in comparison to the components of the non-reconfigurable wireless LAN module 200. In this example, the module 300 has fewer baluns, filters, power amplifiers, low noise amplifiers, and no diplexers in comparison to the module 200. Therefore, the module 300 provides a reduction in component count and potential form factor and cost reduction based on use of adjustable tunable components.

The present design includes tunable radio frequency circuits and systems using piezoelectric switches that are manufactured as part of panel-level organic package substrate technology. In one example, the tunability is achieved by connecting the on-package switches of package substrate 380 to a capacitor bank and selectively turning some of those switches on or off to control the total capacitance value, thereby creating a variable capacitor. When connected to an RF circuit, the variable capacitance translates to a change in the frequency of operation of the circuit. The individual capacitors in the bank can be discrete standalone components that are assembled onto the package substrate. Alternatively, the capacitors can be fabricated as part of the package substrate using, for example, high dielectric constant (Dk) thin films (e.g., Dk>3.9) sandwiched between two metal electrodes.

In one embodiment, the components of the module 300 are embedded in the package substrate 380 or attached on a surface of the package substrate. In one example, the baluns, filters, switches, and matching networks of FIG. 3 are formed within the package substrate 380 and the power amplifier component 306, low noise amplifier component 316, and antenna units 360-361 are attached or coupled to the package substrate 380. The package substrate 380 (e.g., organic substrate) includes organic material with one or more dielectric layers and conductive layers. In another example, the components of the module 300 are embedded in the package substrate.

Figure 4:
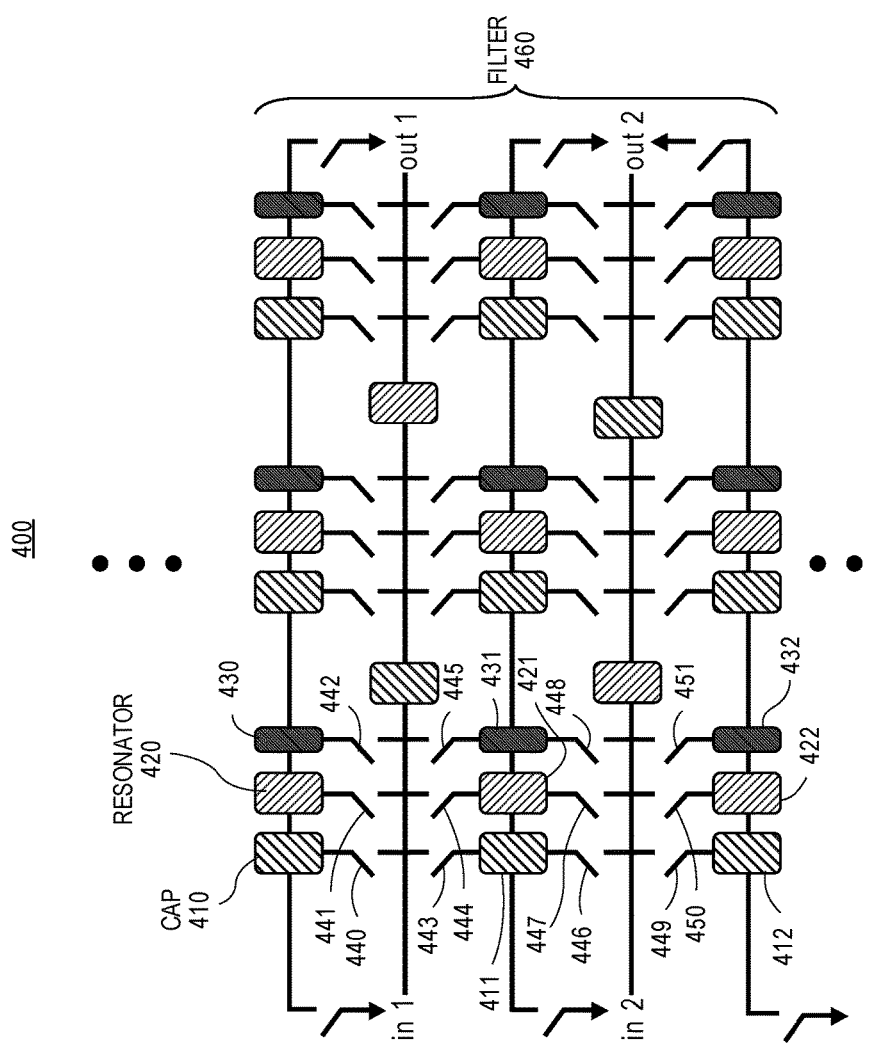
FIG. 4 illustrates a reconfigurable RF filter on a package substrate that is based on coupled resonator networks in accordance with one embodiment.

Wireless communication systems utilize different filters to accommodate different communication standards (e.g., 2G, 3G, 4G, LTE, 5G), different frequency bands according to location, as well as different communication protocols (e.g., WiFi, Bluetooth, GPS). FIG. 4 illustrates a reconfigurable RF filter on a package substrate that is based on coupled resonator networks in accordance with one embodiment. Other embodiments might include different filter structures. Here the switches can be used to connect different capacitors or passives to different resonators, allowing the selection of different bands and/or protocols. In one example, the filter 460 is designed for passing different ranges of frequencies (e.g., high pass filter, band-pass filter with passband signals, low pass filter). The package 400 includes rows of capacitors (e.g., 410-412), resonators (e.g., 420-422), shorting wires or inductors (e.g., 430-432), and piezoelectric switches (e.g., 440-451) for controlling which capacitors and resonators will be used for the reconfigurable RF filter for a particular RF application. Any capacitance or inductance values can be provided within limits of a capacitor bank. In one example, the filter 460 includes multiple inputs (e.g., in 1, in 2) and multiple outputs (e.g., out 1, out 2).

Components other than the capacitor, such as inductors, diodes, resistors, etc. can also be controlled using a similar package-integrated switch to enable more tunability.

Another embodiment involves creating tunable circuits by switching on/off a more complex circuit such as a matching network, a resonator, a balun (e.g., a tunable balun) or a sub-filter which are either standalone or implemented on a microelectronic package.

Other embodiments might include the creation of reconfigurable diplexers/triplexers, etc. Diplexers and triplexers are typically used with radio receivers or transmitters on different, widely separated, frequency bands.

Figure 5:
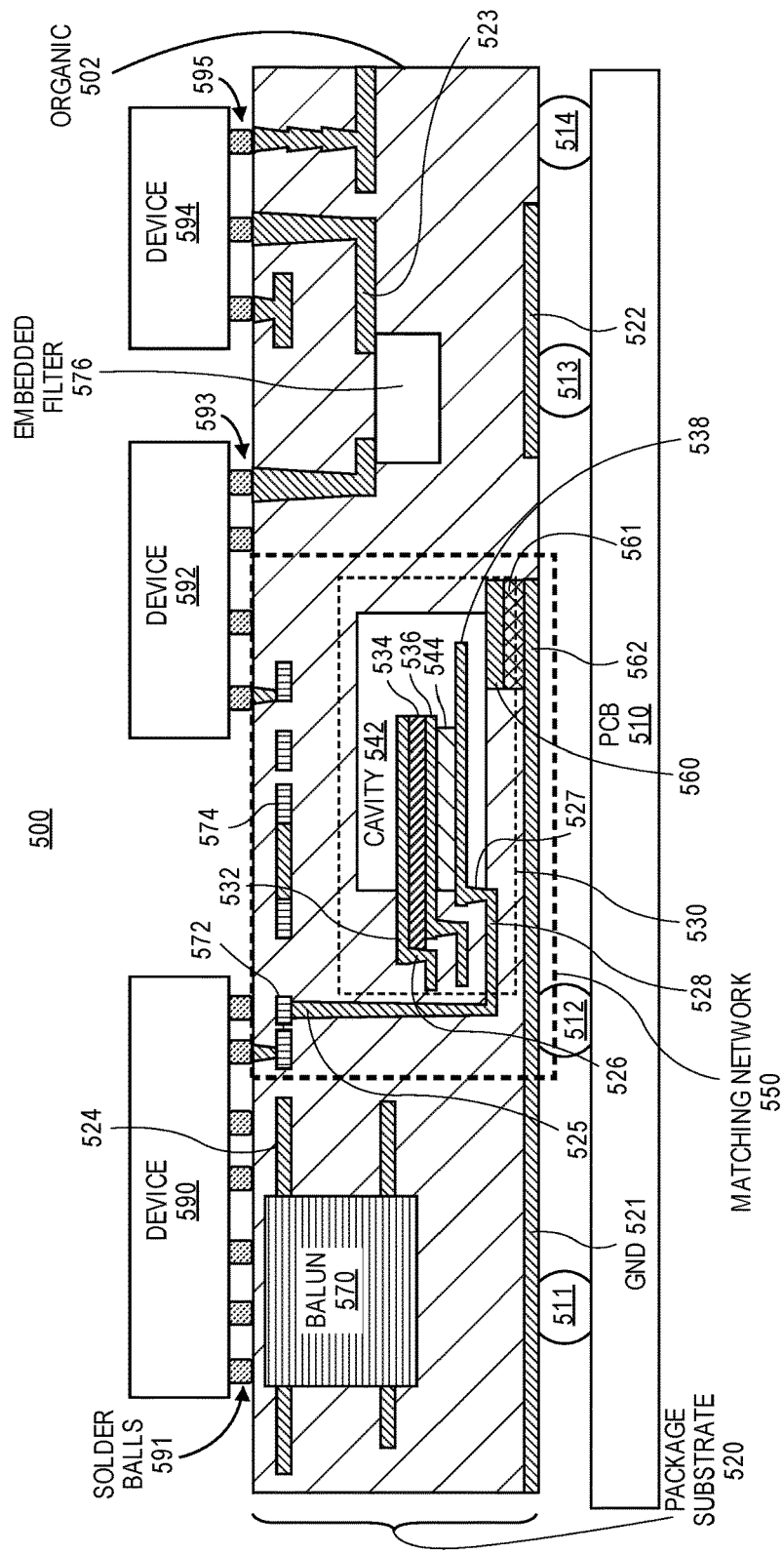
FIG. 5 illustrates a view of a microelectronic device 500 having a package-integrated piezoelectric device for a reconfigurable RF system according to an embodiment of the invention.

Referring now to FIG. 5 a view of a microelectronic device 500 having a package-integrated piezoelectric device for a reconfigurable RF system is shown, according to an embodiment of the invention. In one example, the microelectronic device 500 includes multiple devices 590, 592, and 594 (e.g., die, chip, CPU, silicon die or chip, transceiver die, power amplifier component, low noise amplifier component, Integrated Passive device (IPD) component, power control IC, etc.) that are coupled or attached to a package substrate 520 with solder balls 591, 593, and 595. In one example, the package substrate 520 is coupled or attached to the printed circuit board (PCB) 510 using for example solder balls 511-514.

The package substrate 520 (e.g., organic substrate) includes organic material 502 with one or more dielectric layers and conductive layers 521-528 (e.g., ground layer 521, electrical connections or vias 525-527, etc.). Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 520 can be formed during package substrate processing (e.g., panel level). The panels formed can be large (e.g., having in-plane dimensions approximately 0.5 meter by 0.5 meter or greater, etc.) for lower cost. A cavity 542 is formed within the package substrate 520 by removing one or more layers (e.g., organic layers, organic dielectric layers, conductive layers, etc.) from the package substrate 520. In one example, a piezoelectric switching device 530 is formed with a conductive movable structure 538 (e.g., cantilever 538, beam 538), piezoelectric material 534, and switch activation electrodes 532 and 536. The three structures 532, 534, 536 form a stack. The conductive layer 532 can act as a first electrode and the conductive layer 536 can act as a second electrode of the piezoelectric device or another electrode can be patterned to act as the second electrode of the device. The cavity 542 can be air-filled or vacuum-filled.

Applying a voltage across the electrodes and piezoelectric material produces a stress in the piezoelectric material, causing the entire released structure, to move (e.g., vertically, horizontally, etc.). This in turn produces the mechanical displacement needed to switch between different paths in the microelectronic device 500. For example, the switch activation electrodes 532 and 536 can cause the conductive movable structure 538 to contact (or not contact) a conductive layer 560 (top capacitor electrode) for tuning a matching network 550. An insulating film 544 provides electrical isolation between the electrode 536 and the movable structure 538 and also prevents RF signals from entering the piezoelectric stack which includes the switch activation electrodes 532 and 536 and the piezoelectric film 534. The top capacitor electrode 560 is disposed on a high-k dielectric film 561 (e.g., Dk>3.9, Dk>15) which is disposed on a conductive layer 562 (bottom capacitor electrode). The bottom electrode 562 is part of a ground layer 521. RF signals can be transmitted through the film 561. The stack composed of top capacitor electrode 560, bottom capacitor electrode 562, and high k dielectric film 561 acts as a capacitor. The matching network also includes inductors (e.g., inductors 572, 574). The inductor 572 is coupled to the movable structure 538 with conductive layers 525, 528, and 527. The package substrate also includes a balun 570 and an embedded filter 576.

A capacitor or a capacitor bank can be switched on/off with the matching network 550 between RF sub-circuits by using the package-integrated piezoelectric switch which includes the piezoelectric stack that causes movement of the movable structure 538. A capacitor or capacitor bank can be embedded in the substrate 520 or located on a surface of the substrate 520. Components other than the capacitor, such as inductors, diodes, balun, filter, etc can also be controlled using a similar package-integrated switch to enable more tunability.

In another embodiment, at least one device (e.g., chip) in FIG. 5 may be a discrete passive component or an integrated passive device (IPD) that is connected to a tunable sub-circuit on the package 520 containing at least one package integrated switch. In some embodiments, one or many of the dies may be embedded inside the substrate. As shown in FIG. 5, a tunable component may be connected between several chips and the ground. However, this is not the only configuration, since it may also be connected in series with a device (e.g., chip) as illustrated in FIG. 6.

Figure 6:
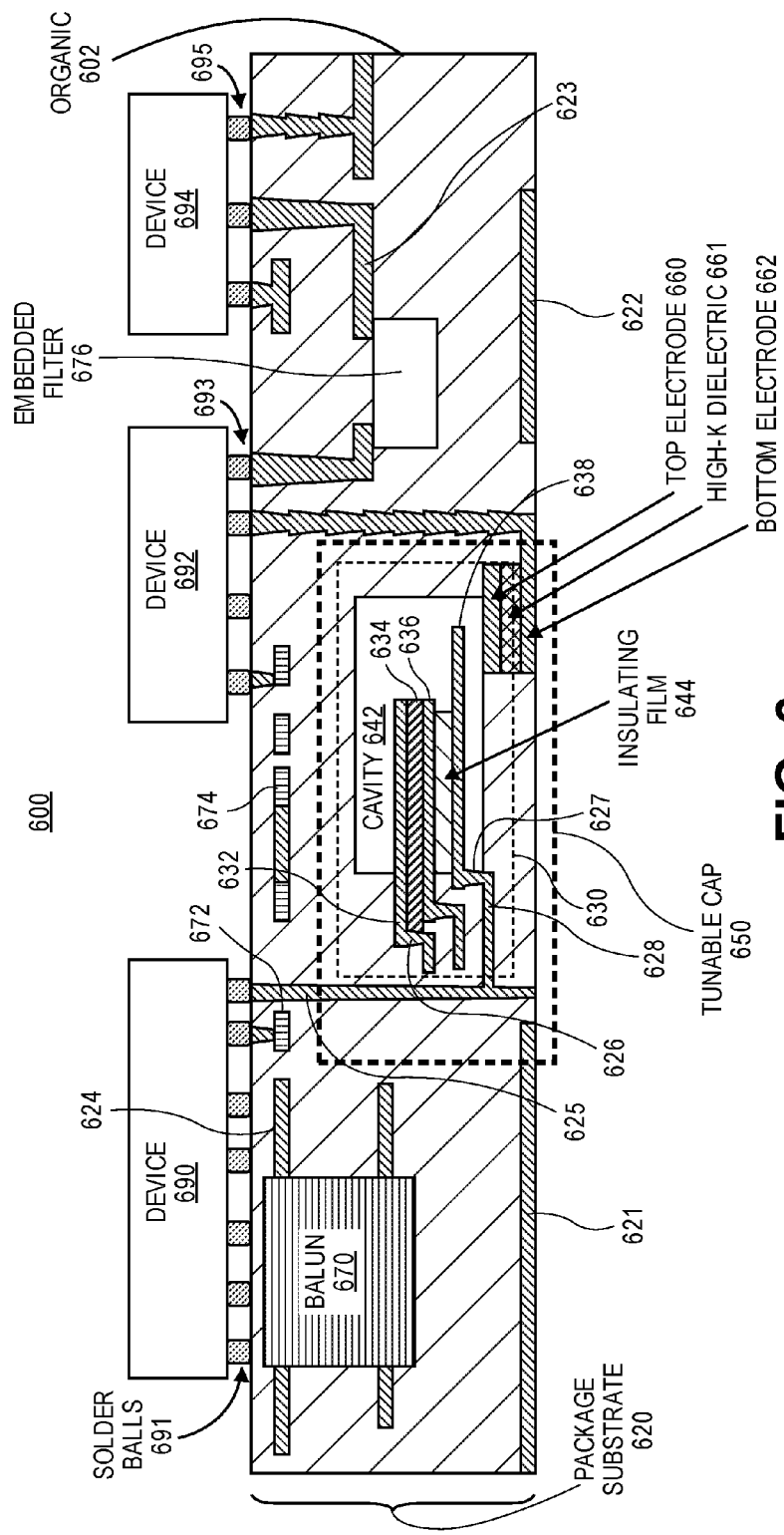
FIG. 6 illustrates a view of a microelectronic device 600 having a package-integrated piezoelectric device for a reconfigurable RF system according to an embodiment of the invention.

FIG. 6 illustrates a view of a microelectronic device 600 having a package-integrated piezoelectric device for a reconfigurable RF system according to an embodiment of the invention. In one example, the microelectronic device 600 includes multiple devices 690, 692, and 694 (e.g., die, chip, CPU, silicon die or chip, transceiver die, power amplifier component, low noise amplifier component, etc.) that are coupled or attached to a package substrate 620 (or optional printed circuit board) with solder balls 691, 693, and 695.

The package substrate 620 (e.g., organic substrate) includes organic material 602 with one or more dielectric layers and conductive layers 621-628 (e.g., ground layer 621, electrical connections or vias 625-627, etc.). Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 620 can be formed during package substrate processing (e.g., panel level). The panels formed can be large (e.g., having in-plane dimensions approximately 0.5 meter by 0.5 meter or greater, etc.) for lower cost. A cavity 642 is formed within the package substrate 620 by removing one or more layers (e.g., organic layers, organic dielectric layers, conductive layers, etc.) from the package substrate 620. In one example, a piezoelectric switching device 630 is formed with a conductive movable structure 638 (e.g., cantilever 638, beam 638), piezoelectric material 634, and switch activation electrodes 632 and 636. The three structures 632, 634, 636 form a stack. The conductive layer 632 can act as a first electrode and the conductive layer 636 can act as a second electrode of the piezoelectric device or another electrode can be patterned to act as the second electrode of the device. The cavity 642 can be air-filled or vacuum-filled.

Applying a voltage across the electrodes and piezoelectric material produces a stress in the piezoelectric material, causing the entire released structure, to move (e.g., vertically, horizontally, etc.). This in turn produces the mechanical displacement needed to switch between different paths in the microelectronic device 600. For example, the switch activation electrodes 632 and 636 can cause the conductive movable structure 638 to contact (or not contact) a conductive layer 660 (top capacitor electrode) for tuning a capacitor 650. An insulating film 644 provides electrical isolation between the electrode 636 and the movable structure 638 and also prevents RF signals from entering the piezoelectric stack. The top electrode 660 of a capacitor is disposed on a high-k dielectric film 661 (e.g., Dk>3.9, Dk>15) which is disposed on a conductive layer 662 (bottom electrode of the capacitor). The substrate 620 also includes inductors (e.g., inductors 672, 674). The inductor 672 is coupled to the device 690. The package substrate also includes a balun 670 and an embedded filter 676. The device 690 is coupled to the movable structure 638 with electrical connections 625, 628, and 627. The bottom electrode 662 is coupled to the device 692. Thus, the tunable capacitor 650 can be connected in series with another device (e.g., device 690) using the switching device 630. The components shown (e.g., balun, filter, etc) can be embedded in or surface mounted on the package 620 and can be also switched using a similar package-integrated piezo-switch (e.g., switching device 630).

In one example, FIGS. 5 and 6 illustrate configurations in which a switching device is created in a metal layer of the package and can be either a single pole, single throw switch (SPST). Alternatively, a switching device can be a single pole, double throw (SPDT) switch, providing connection of the metal layer to the metal layer below and/or above. A number of poles indicates a number of electrically separate switches which are controlled by a single physical actuator. A number of throws indicates a number of separate conductive pathways other than "open" that the switching device can adopt for each pole.

The switching device includes one movable structure (e.g., cantilever 538, 638) coupled to a piezoelectric material that can actuate the cantilever in the vertical direction once a voltage is applied to the electrode. The cantilever is anchored on one edge by package connections 527 or 627 (e.g., anchors, vias) which serve as both mechanical anchors as well as electrical connections to the rest of the package. A free released end of the cantilever, which experiences the largest displacement when the piezoelectric stack is actuated, is free to move and provides the electrical connection to a conductive layer (e.g., top electrode 560, top electrode 660). For MEMS, two different types of contacts, namely ohmic and capacitive contacts can be used.

FIGS. 5 and 6 illustrate cross-sectional views of the present design which includes a multilayer package substrate and several integrated circuits. The package substrate has multiple conductive metal layers that can be used to form components such as inductors, transformers and transmission lines. In addition, the substrate may also include at least one layer of piezoelectric material and at least one layer of high-k dielectric material. Those layers may be patterned as needed and connected to on-package electrodes to form switches and capacitors respectively. Alternatively, the package-integrated switches may be connected to discrete capacitors, inductors, transformers, etc. that are assembled as separate components onto or embedded into the package substrate instead of being fabricated as part of the substrate.

Although FIGS. 5 and 6 show one cantilever, other embodiments can have more than one cantilever connected electrically in parallel and thus resulting in decreased contact resistance. Other embodiments might have different cantilever shapes and different switch configurations such as double pole, double throw (DPDT), four pole, double throw (4PDT) etc. as well as incorporating horizontal vs. vertical motion or any other direction caused by actuation of the piezoelectric stack.

Figure 7:
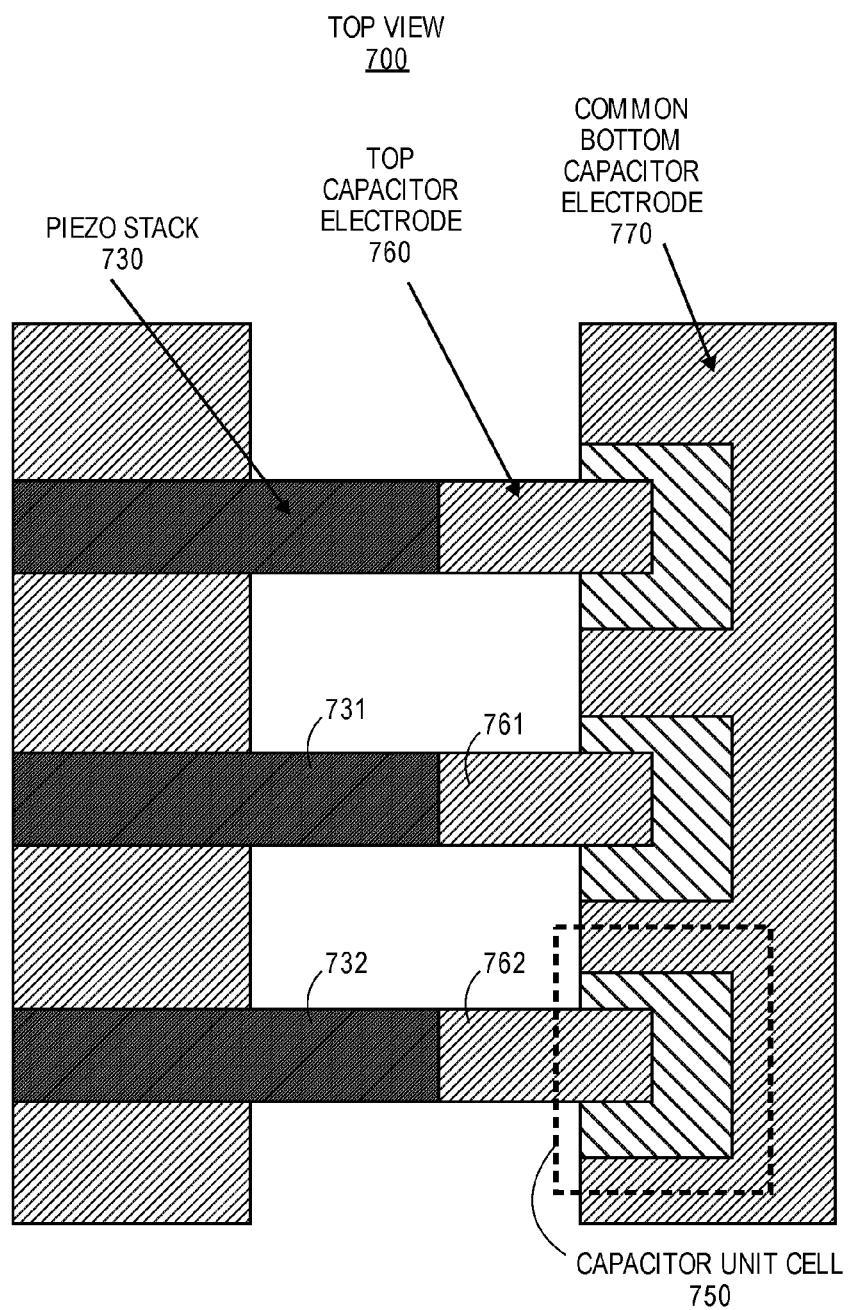
FIG. 7 illustrates a top view 700 of a package substrate having package-integrated piezoelectric switching devices (e.g., n poles, n throws) for a tunable capacitor bank, according to an embodiment.

In one example the capacitor includes a capacitor bank formed on one or multiple layers of the substrate. The capacitor bank may have a common bottom electrode and several top electrode fingers that are connected to a common conductive trace as shown in FIG. 7. Each finger has a piezoelectric switch that includes a piezoelectric film sandwiched between two conductive actuation electrodes. Applying an appropriate voltage to the actuation electrodes sandwiching the piezoelectric film causes the finger to move towards the bottom capacitor electrode, resulting in a connection between the individual actuated finger and the bottom capacitor electrode. The total capacitance is directly dependent on the number of connections between the capacitor top fingers and the common bottom electrode. FIG. 7 shows a potential implementation of a tunable capacitor on package using a combination of switches and the capacitor bank.

Figure 8:
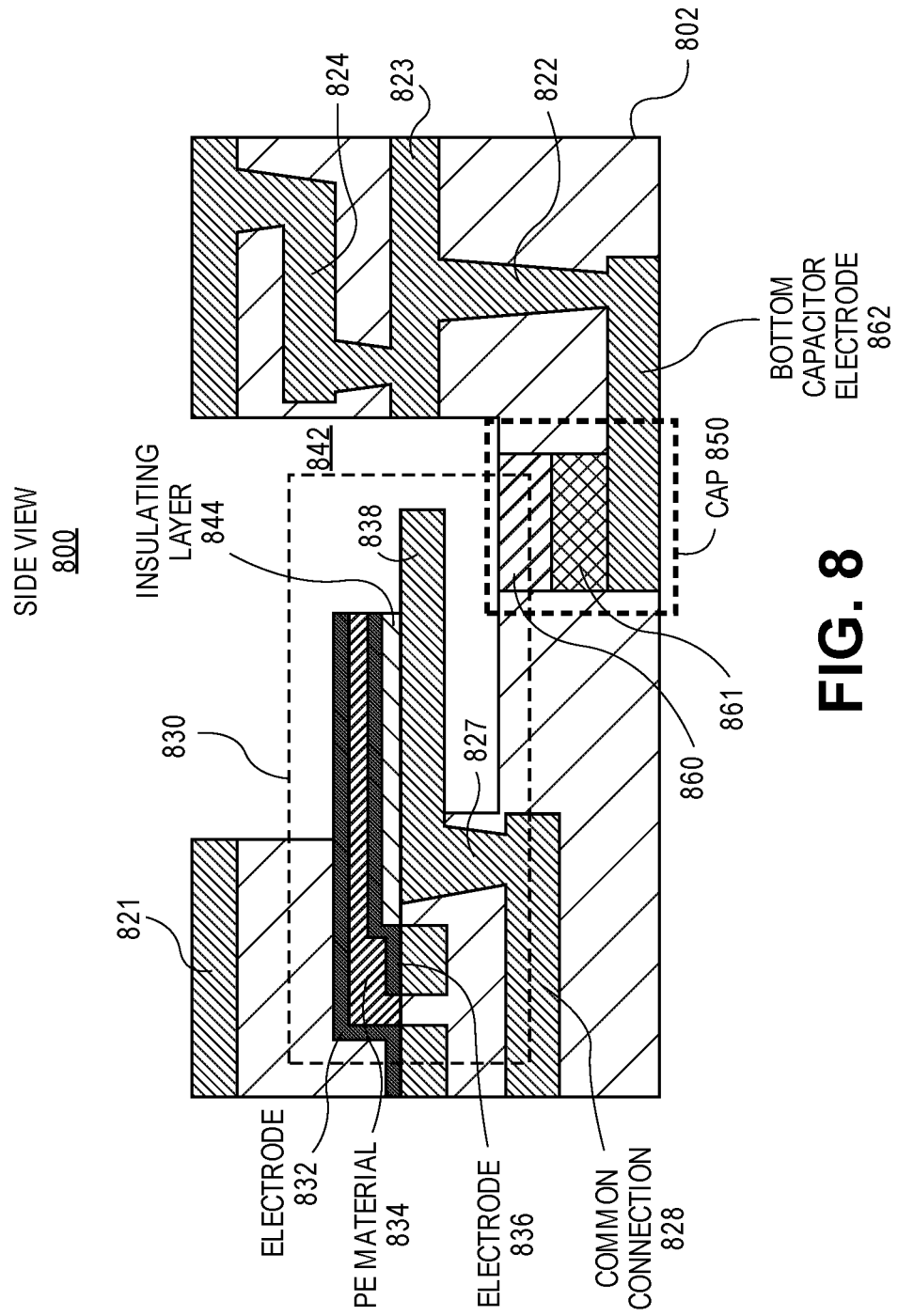
FIG. 8 illustrates a cross-sectional side view 800 of a package substrate having package-integrated piezoelectric switching devices (e.g., n poles, n throws) for a tunable capacitor bank, according to an embodiment.

FIG. 7 illustrates a top view 700 of a package substrate having package-integrated piezoelectric switching devices (e.g., n poles, n throws) for a tunable capacitor bank, according to an embodiment. The package substrate 700 (e.g., organic substrate) includes an organic dielectric material 802 as seen in FIG. 8, piezoelectric stacks 730-732, top capacitor electrodes 760-762, and a common bottom capacitor electrode 770. A capacitor unit cell 750 includes a top electrode 762, dielectric film 861, and bottom electrode 770. Thus, the package substrate includes n poles, n throws switching devices for tuning a tunable capacitor bank.

FIG. 8 illustrates a cross-sectional side view 800 of a package substrate having package-integrated piezoelectric switching devices (e.g., n poles, n throws) for a tunable capacitor bank, according to an embodiment. In one example, the package substrate 800 may be coupled or attached to multiple devices (e.g., die, chip, CPU, silicon die or chip, transceiver chip, IPD, etc.) and also coupled or attached to a printed circuit board (e.g., PCB 110). The package substrate 800 (e.g., organic substrate) includes organic dielectric layers 802 and conductive layers 821-824, 827, 832, 836, and 838. The package substrate 800 can be formed during package substrate processing (e.g., panel level). A cavity 842 is formed within the package substrate 800 by removing one or more layers (e.g., organic layers, dielectric layers, etc.) from the package substrate 800. In one example, a piezoelectric switching device 830 is formed with n conductive movable structures 838 (e.g., cantilevers 838, beams 838), piezoelectric material 834, and conductive layers 832 and 836. The conductive layer 832 can act as a first top electrode and the layer 836 can act as a second bottom electrode of the piezoelectric device. Alternatively, the movable structure 838 can act as a second bottom electrode for a different embodiment. If a different layer 836 is used as a bottom electrode then an insulating passivation layer 844 may optionally be deposited between the bottom electrode 836 and the layer 838. The different layers are deposited and patterned sequentially as part of the fabrication process of the stack. The cavity 842 can be air-filled or vacuum-filled.

In one example, FIG. 8 shows one configuration in which a switching device 830 is created in a metal layer (e.g., structure 838, cantilever 838) of the package and can be either a n pole, n throw switch, a single pole, single throw switch (SPST), or a single pole, double throw switch (SPDT), providing connection of the metal layer 838 to the metal layer below and/or above (e.g., conductive layer 860).

In one example, the switching device includes n cantilevers 838 coupled to a piezoelectric stack that can actuate the cantilevers in the vertical direction once a voltage is applied to the stack. The cantilever 838 is anchored on one edge by package connections 827 (e.g., anchors, vias) which serve as both mechanical anchors as well as electrical connections to the rest of the package. A free released end of each cantilever, which experiences the largest displacement when the piezoelectric stack is actuated, is free to move and provides the electrical connection to a conductive layer (e.g., layer 860).

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more sensing devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 9:
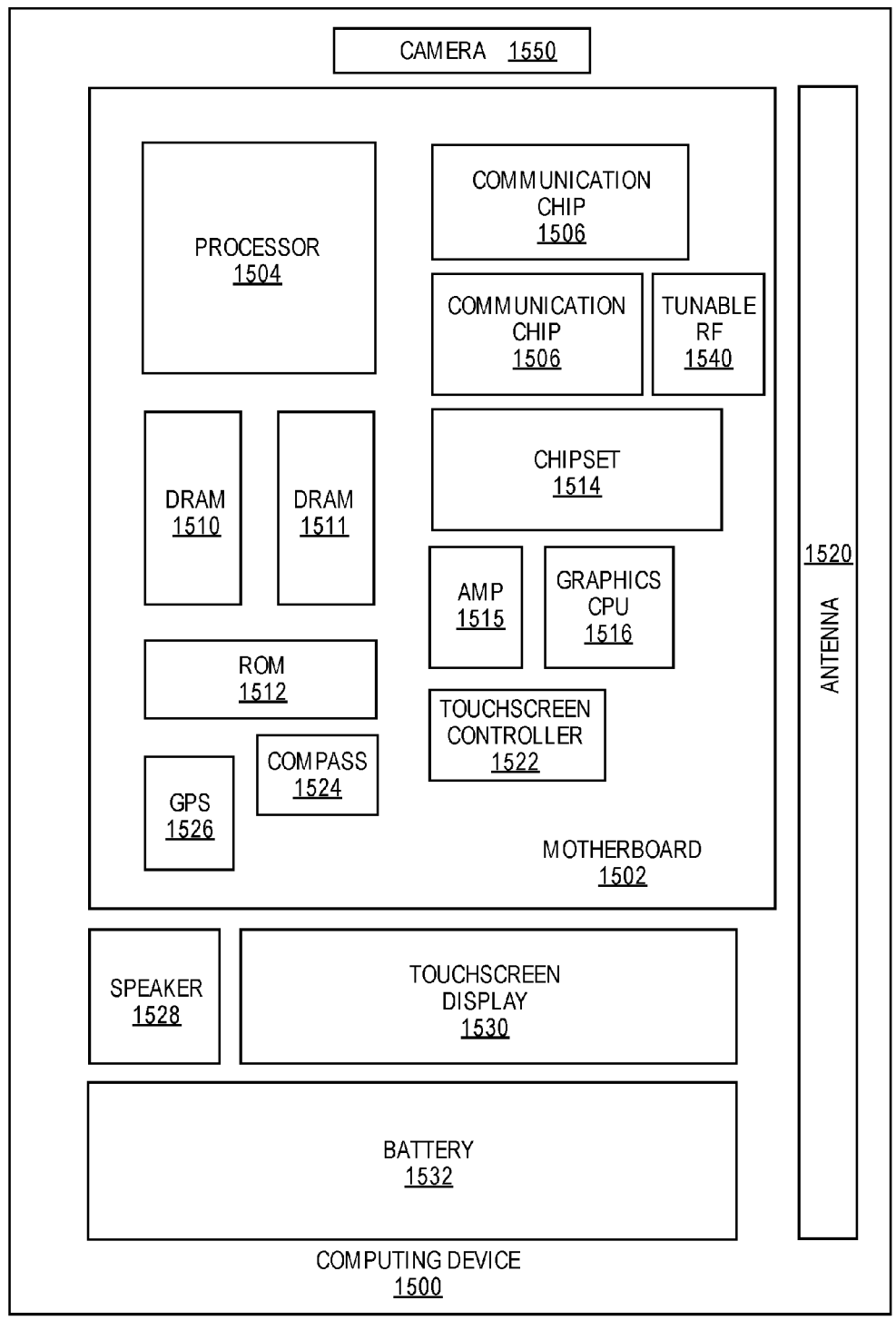
FIG. 9 illustrates a computing device 1500 in accordance with one embodiment of the invention.

FIG. 9 illustrates a computing device 1500 in accordance with one embodiment of the invention. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM 1510, 1511), non-volatile memory (e.g., ROM 1512), flash memory, a graphics processor 1516, a digital signal processor, a crypto processor, a chipset 1514, an antenna 1520, a display, a touchscreen display 1530, a touchscreen controller 1522, a battery 1532, an audio codec, a video codec, a power amplifier 1515, a global positioning system (GPS) device 1526, a compass 1524, tunable RF component(s) 1540 (e.g., tunable matching network, tunable Balun, tunable filters, tunable capacitors, piezoelectric switching devices), a gyroscope, a speaker, a camera 1550, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi, WiGig and Bluetooth and a second communication chip 1506 may be dedicated to longer range wireless communications such as GPS, EDGE, GPRS, CDMA, WiMAX, LTE, Ev-DO, 5G, and others.

The processor 1504 of the computing device 1500 includes an integrated circuit die packaged within the processor 1504. In some implementations of the invention, the integrated circuit processor package or motherboard 1502 includes one or more devices, such as tunable RF components in accordance with implementations of embodiments of the invention. The term "processor" may refer to any device or portion of a device that processes electronic data from registers and/or memory to transform that electronic data into other electronic data that may be stored in registers and/or memory. The communication chip 1506 also includes an integrated circuit die packaged within the communication chip 1506.

The following examples pertain to further embodiments. Example 1 is a tunable radio frequency (RF) communication module comprising a transmitting component having at least one tunable component, the transmitting component for transmitting communications. A receiving component includes at least one tunable component, the receiving component for receiving communications. At least one piezoelectric switching device is coupled to at least one of the transmitting and receiving components. The at least one piezoelectric switching device to be formed within an organic substrate having organic material and being designed to tune at least one tunable component of the tunable RF communication module.

In example 2, the subject matter of example 1 may optionally further include the at least one piezoelectric switching device including first and second electrodes, a piezoelectric material interposed between the first and second electrodes, and a cantilever having a released end that moves from a first position to a second position for actuation of the switching device upon application of voltage between the first and second electrodes.

In example 3, the subject matter of any of examples 1-2 may optionally further include the transmitting component having a tunable balun formed within the organic substrate and a power amplifier component attached to a surface of the organic substrate. The at least one tunable component of the transmitting component comprises a tunable filter.

In example 4, the subject matter of any of examples 1-3 may optionally further include the receiving component having a tunable balun formed within the organic substrate and a low noise amplifier component attached to a surface of the organic substrate. The at least one tunable component of the receiving component comprises a tunable filter.

In example 5, the subject matter of any of examples 1-4 may optionally further include a first tunable matching network formed within the organic substrate and a first antenna unit coupled to the first tunable matching network. The first antenna unit is capable of transmitting communications at multiple frequency bands.

In example 6, the subject matter of example 5 may optionally further include a second tunable matching network formed within the organic substrate and a second antenna unit coupled to the second tunable matching network. The second antenna unit being capable of receiving communications at multiple frequency bands.

In example 7, the subject matter of any of examples 1-6 may optionally further include the piezoelectric switching device being integrated with the organic substrate during panel level fabrication of the organic substrate.

Example 8 is a package substrate that includes a plurality of organic dielectric layers and a plurality of conductive layers to form the package substrate of a reconfigurable radio frequency (RF) system, a cavity formed in the package substrate, and a piezoelectric switching device integrated within the package substrate. The piezoelectric switching device having a piezoelectric material that is coupled to first and second electrodes and a movable structure that is mechanically coupled to one of the electrodes. The movable structure having a released end positioned within the cavity and being capable of switching from a first position to a second position based on actuation of the piezoelectric switching device to tune a tunable component of the reconfigurable RF system.

In example 9, the subject matter of example 8 may optionally further include the tunable component including at least one of a capacitor or capacitor bank, at least one inductor, at least one diode, at least one balun, and at least one filter.

In example 10, the subject matter of any of examples 8-9 may optionally further include the tunable component comprising a capacitor bank having a plurality of first electrodes and a common second electrode and the switching device comprising a plurality of cantilevers for selectively contacting at least one of the plurality of first electrodes to adjust a total capacitance value for creating a variable capacitor which then causes a change in a frequency of operation of the RF system.

In example 11, the subject matter of any of examples 8-11 may optionally further include a passivation material positioned to electrically isolate one of the electrodes and the movable structure.

In example 12, the subject matter of any of examples 8-11 may optionally further include the released end of the movable structure moving from a first position to a second position for actuation of the switching device upon application of a voltage differential between the first and second electrodes.

In example 13, the subject matter of any of examples 8-12 may optionally further include the released end of the movable structure being suspended in the cavity while in the first position and the released end of the movable structure forms an ohmic contact with a conductive layer while in the second position to form a conductive pathway.

In example 14, the subject matter of any of examples 8-13 may optionally further include the first and second electrodes comprising switch activation electrodes to cause the movable structure to contact or not contact a conductive layer for tuning a matching network of the package substrate.

In example 15, the subject matter of any of examples 8-14 may optionally further include the first and second electrodes and piezoelectric material being designed to actuate a plurality of movable structures in the cavity.

In example 16, the subject matter of any of examples 8-15 may optionally further include the piezoelectric switching device being integrated with the organic substrate during panel level fabrication of the organic substrate.

In example 17, a computing device comprises at least one processor to process data and a reconfigurable communication module coupled to the at least one processor. The reconfigurable communication module includes a transceiver die and a package substrate coupled to the transceiver die. The package substrate includes a plurality of organic dielectric layers, a plurality of conductive layers, and a piezoelectric switching device having a piezoelectric material that is coupled to first and second electrodes and a movable structure that is mechanically coupled to one of the electrodes. The movable structure having a released end positioned within a cavity of the package substrate and being capable of switching from a first position to a second position based on actuation of the piezoelectric switching device to tune a tunable component of the reconfigurable communication module.

In example 18, the subject matter of example 17 may optionally further include a printed circuit board coupled to the package substrate.

In example 19, the subject matter of any of examples 17-18 may optionally further include the tunable component including at least one of a capacitor or capacitor bank, at least one inductor, at least one diode, at least one balun, and at least one filter.

In example 20, the subject matter of any of examples 17-19 may optionally further include having a piezoelectric material that is coupled to first and second electrodes and a movable structure that is mechanically coupled to one of the electrodes. The movable structure having a released end positioned within the cavity and being capable of switching from a first position to a second position based on actuation of the piezoelectric switching device to tune a tunable component of the reconfigurable RF system.

Example 21 is a reconfigurable RF filter formed in a package substrate comprising a plurality of organic dielectric layers and a plurality of conductive layers to form the package substrate and a piezoelectric switching device integrated within the package substrate. The piezoelectric switching device includes a piezoelectric material that is coupled to first and second electrodes and a movable structure that is mechanically coupled to one of the electrodes. The movable structure having a released end positioned within a cavity and being capable of switching from a first position to a second position based on actuation of the piezoelectric switching device to tune a tunable component of the reconfigurable RF filter.

In example 22, the subject matter of example 21 may optionally further include the tunable component including at least one of the following components: a capacitor or capacitor bank, at least one inductor, at least one diode, at least one balun, and at least one resonator.

In example 23, the subject matter of any of examples 21-22 may optionally further include the reconfigurable filter being designed for passing different ranges of frequencies including at least one of a high pass filter, a band-pass filter with passband signals, and a low pass filter.

The invention claimed is:

1. A reconfigurable tunable radio frequency (RF) communication module, comprising:
 a transmitting component having at least one tunable component, the transmitting component for transmitting communications with different frequency bands;
 a receiving component having at least one tunable component, the receiving component for receiving communications with different frequency bands; and
 at least one piezoelectric switching device coupled to at least one of the transmitting and receiving components, the at least one piezoelectric switching device to be formed within an organic substrate having organic material and being designed to switch between first and second switching positions to tune at least one tunable component of the reconfigurable tunable RF communication module to switch between the different frequency bands, wherein the at least one piezoelectric switching device includes first and second electrodes, a piezoelectric material interposed between the first and second electrodes, and a cantilever having a released end that moves from a first position to a second position for actuation of the switching device upon application of voltage between the first and second electrodes, the released end of the cantilever coupled directly to one of the first and second electrodes by an insulating film, wherein the insulating film is in contact with the released end of the cantilever, and the insulating film is in contact with the one of the first and second electrodes.

2. The communication module of claim 1, wherein the transmitting component further comprises a tunable balun formed within the organic substrate and a power amplifier component attached to a surface of the organic substrate, wherein the at least one tunable component of the transmitting component comprises a tunable filter.

3. The communication module of claim 1, wherein the receiving component further comprises a tunable balun formed within the organic substrate and a low noise amplifier component attached to a surface of the organic substrate, wherein the at least one tunable component of the receiving component comprises a tunable filter.

4. The communication module of claim 1, further comprising:
 a first tunable matching network formed within the organic substrate;
 a first antenna unit coupled to the first tunable matching network, the first antenna unit being capable of transmitting communications at multiple frequency bands.

5. The communication module of claim 1, wherein the piezoelectric switching device is integrated with the organic substrate during panel level fabrication of the organic substrate.

6. The communication module of claim 1, wherein the insulating film prevents RF signals from entering the piezoelectric material and the first and second electrodes.

7. The communication module of claim 4, further comprising:
 a second tunable matching network formed within the organic substrate;
 a second antenna unit coupled to the second tunable matching network, the second antenna unit being capable of receiving communications at multiple frequency bands.

8. A package substrate comprising:
 a plurality of organic dielectric layers and a plurality of conductive layers to form the package substrate of a reconfigurable radio frequency (RF) system for transmitting and receiving communications with different frequency bands;
 a cavity formed in at least one organic dielectric layer of the plurality of organic dielectric layers of the package substrate; and
 a piezoelectric switching device integrated within the cavity of the package substrate, the piezoelectric switching device having a piezoelectric material that is coupled to first and second electrodes and a movable structure having a released end that is directly coupled to one of the first and second electrodes by an insulating film, wherein the insulating film is in contact with the released end of the moveable structure, and the insulating film is in contact with the one of the first and second electrodes, the released end positioned within the cavity and being capable of switching from a first position to a second position based on actuation of the piezoelectric switching device to tune a tunable component of the reconfigurable RF system.

9. The package substrate of claim 8, wherein the tunable component includes at least one of a capacitor or capacitor bank, at least one inductor, at least one diode, at least one balun, and at least one filter.

10. The package substrate of claim 8, wherein the tunable component comprises a capacitor bank having a plurality of first electrodes and a common second electrode and the switching device comprises a plurality of cantilevers for selectively contacting at least one of the plurality of first electrodes to adjust a total capacitance value for creating a variable capacitor which then causes a change in a frequency of operation of the RF system.

11. The package substrate of claim 8, further comprising:
 a passivation material positioned to electrically isolate one of the electrodes and the movable structure.

12. The package substrate of claim 8, wherein the released end of the movable structure moves from a first position to a second position for actuation of the switching device upon application of a voltage differential between the first and second electrodes.

13. The package substrate of claim 8, wherein the released end of the movable structure is suspended in the cavity while in the first position and the released end of the movable structure forms an ohmic contact with a conductive layer while in the second position to form a conductive pathway.

14. The package substrate of claim 8, wherein the first and second electrodes comprise switch activation electrodes to cause the movable structure to contact or not contact a conductive layer for tuning a matching network of the package substrate.

15. The package substrate of claim 8, wherein the first and second electrodes and piezoelectric material are designed to actuate a plurality of movable structures in the cavity.

16. The package substrate of claim 8, wherein the piezoelectric switching device is integrated with the organic substrate during panel level fabrication of the organic substrate.

17. A computing device comprising:
- at least one processor to process data; and
- a reconfigurable communication module coupled to the at least one processor, the reconfigurable communication module includes a transceiver die and a package substrate coupled to the transceiver die, the package substrate includes a plurality of organic dielectric layers, a plurality of conductive layers, a cavity formed in at least one organic dielectric layer of the plurality of organic dielectric layers of the package substrate, and a piezoelectric switching device integrated within the cavity of the package substrate, the piezoelectric switching device having a piezoelectric material that is coupled to first and second electrodes and a movable structure that is mechanically coupled to one of the electrodes, the movable structure having a released end positioned within the cavity of the package substrate and being capable of switching from a first position to a second position based on actuation of the piezoelectric switching device to tune a tunable component of the reconfigurable communication module, wherein the piezoelectric material is coupled to first and second electrodes and a movable structure having a released end that is directly coupled to one of the first and second electrodes by an insulating film, wherein the insulating film is in contact with the released end of the moveable structure, and the insulating film is in contact with the one of the first and second electrodes, the released end positioned within the cavity and being capable of switching from a first position to a second position based on actuation of the piezoelectric switching device to tune a tunable component of the reconfigurable RF system.

18. The computing device of claim 17, further comprising:
- a printed circuit board coupled to the package substrate.

19. The computing device of claim 17, wherein the tunable component includes at least one of a capacitor or capacitor bank, at least one inductor, at least one diode, at least one balun, and at least one filter.

20. A reconfigurable RF filter formed in a package substrate comprising:
- a plurality of organic dielectric layers and a plurality of conductive layers to form the package substrate having the reconfigurable RF filter;
- a cavity formed in at least one organic dielectric layer of the plurality of organic dielectric layers of the package substrate; and
- a piezoelectric switching device integrated within the cavity of the package substrate, the piezoelectric switching device having a piezoelectric material that is coupled to first and second electrodes and a movable structure having a released end that is directly coupled to one of the first and second electrodes by an insulating film, wherein the insulating film is in contact with the released end of the moveable structure, and the insulating film is in contact with the one of the first and second electrodes, the released end positioned within the cavity and being capable of switching from a first position to a second position based on actuation of the piezoelectric switching device to tune a tunable component of the reconfigurable RF filter.

21. The reconfigurable RF filter of claim 20, wherein the tunable component includes at least one of the following components:
- a capacitor or capacitor bank, at least one inductor, at least one diode, at least one balun, and at least one resonator.

22. The reconfigurable RF filter of claim 20, wherein the reconfigurable filter is designed for passing different ranges of frequencies including at least one of a high pass filter, a band-pass filter with passband signals, and a low pass filter.

* * * * *